(12) United States Patent
Nakamura

(10) Patent No.: US 6,611,031 B2
(45) Date of Patent: Aug. 26, 2003

(54) SEMICONDUCTOR DEVICE AND METHOD FOR ITS MANUFACTURE

(75) Inventor: Ryoichi Nakamura, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/965,693

(22) Filed: Sep. 27, 2001

(65) Prior Publication Data

US 2002/0109197 A1 Aug. 15, 2002

(30) Foreign Application Priority Data

Sep. 28, 2000 (JP) .......................... 2000-297486

(51) Int. Cl.[7] .......................................... H01L 21/8238
(52) U.S. Cl. ..................... 257/408; 257/410; 257/411; 257/327; 438/216; 438/261
(58) Field of Search ................. 257/408, 391, 257/371, 396, 392, 368, 344, 345, 395, 397; 408/410, 404, 405, 443, 257, 258, 262, 264

(56) References Cited

U.S. PATENT DOCUMENTS

| | | | | |
|---|---|---|---|---|
| 5,125,007 A | * | 6/1992 | Yamaguchi et al. | 357/23.7 |
| 5,801,081 A | * | 9/1998 | Warashina et al. | 438/410 |
| 5,976,934 A | * | 11/1999 | Hayakawa | 438/258 |
| 6,096,583 A | * | 8/2000 | Iwamatsu et al. | 438/149 |
| 6,281,558 B1 | * | 8/2001 | Sayama et al. | 257/391 |
| 6,333,228 B1 | * | 12/2001 | Hsie et al. | 438/257 |

FOREIGN PATENT DOCUMENTS

| | | |
|---|---|---|
| JP | 54-78672 | 6/1979 |
| JP | 01-264264 | 10/1989 |
| JP | 3-296270 | 12/1991 |
| JP | 7-211783 | 8/1995 |
| JP | 8-181223 | 7/1996 |
| JP | 8-255881 | 10/1996 |
| JP | 9-181312 | 7/1997 |
| JP | 10-41407 | 2/1998 |
| JP | 10-335656 | 12/1998 |
| JP | 11-274494 | 10/1999 |
| JP | 2002-26139 | 1/2002 |

* cited by examiner

Primary Examiner—Nathan J. Flynn
Assistant Examiner—Fazli Erdem
(74) Attorney, Agent, or Firm—Darryl G. Walker; Bradley T. Sako

(57) ABSTRACT

A semiconductor device is disclosed including an insulated gate field effect transistor (IGFET) having a gate insulating layer (2), a gate electrode (3), and a source-drain layer (5). The IGFET may include a bird's beak insulating film (4) in a region in which the gate insulating layer (2) overlaps the source-drain layer (5). The bird's beak insulating film (4) may have a thickness that is greater than the gate insulating film (2). In this way, inter-band tunneling may be reduced. A plurality of IGFETs may include bird's beak insulating films having different configurations in accordance with operating conditions of the circuit in which the particular IGFET is included.

18 Claims, 8 Drawing Sheets

SEMICONDUCTOR DEVICE AND METHOD FOR ITS MANUFACTURE

TECHNICAL FIELD

The present invention relates generally to a semiconductor device and method for its manufacture, and more specifically to a semiconductor device including an insulated gate field effect transistor (IGFET) having a particular gate electrode insulation structure and a method of its manufacture.

BACKGROUND OF THE INVENTION

In order to reduce manufacturing costs and provide more components on a semiconductor device, semiconductor devices are being made with finer structures. Such components include insulated gate field effect transistors (IGFETs), such as metal-oxide-semiconductor field effect transistors (MOSFETs). Semiconductor devices such as memory devices and logic devices are now being made in which minimum line widths are about 0.15 µm.

As IGFETs become finer, the film thickness of the gate insulating film becomes finer. In such cases, the gate insulating film can be a silicon oxide film having a thickness of about several nanometers. In a conventional IGFET, such as a MOSFET structure, once the gate insulating film is made thinner, a steep band bending may occur on the surface of a drain region that is overlapped by and separated from the gate electrode by the gate insulating film. Although in this case, while the gate electrode may be biased so that the MOSFET is in the non-conduction state, a leakage current may be increased due to inter-band tunneling of electrons between a valence band and a conduction band. The tunneling occurring due to the above-mentioned band bending has been reported in "International Electron Device Meeting (IEDM), 1987, pp. 718–721."

The above-mentioned tunneling phenomenon will now be described with reference to FIGS. 1A and 1B.

Referring now to FIG. 1A, a cross sectional view of a portion of a conventional N-channel MOSFET is set forth.

As illustrated in FIG. 1A, a silicon substrate having a P-type conductivity is connected to a ground potential. The potential Vg of a gate electrode is also connected to the ground potential. The gate electrode is separated from the substrate by a gate insulating film. A drain region having a $n^+$ type conductivity is formed on the substrate surface. An electric potential Vd is applied to the drain region. Once the electric potential Vd is applied to the drain region, a depletion region (indicated by the dashed line) is formed at the p-n junction formed at the interface of the drain region and substrate. Holes and electrons may be produced in the depletion region. The electric field causes the positive holes to flow into the substrate and the negative electrons to flow into the drain region. In this way, a leakage current is caused by inter-band tunneling as mentioned above.

Referring now to FIG. 1B, a band diagram of an N-channel MOSFET and a P-channel MOSFET is set forth. The band diagram on the left illustrates a band diagram of an N-channel MOSFET as shown in FIG. 1A along the line X-Y. The band diagram on the right illustrates a band diagram along a similar line for a P-channel MOSFET.

In the case of the N-channel MOSFET, the band has a higher energy at the gate (G) and the energy is lowered across the gate insulating film (Ox) to the drain (D). As the gate insulating film (Ox) becomes thinner, a steep band bending occurs in the drain (D). Thus, electrons in the valence band may tunnel to the conduction band thereby forming holes in the valance band. This activity of the electrons flowing from the substrate to the drain and creating holes flowing to the substrate create a leakage current in the substrate.

In the case of the P-channel MOSFET, the band energy levels are reversed. Thus, the band has a lower energy at the gate (G) and the energy is increased across the gate insulating film (Ox) to the drain (D). As the gate insulating film (Ox) becomes thinner, a steep band bending occurs in the drain (D). Thus, electrons in the valence band may tunnel to the conduction band thereby forming holes in the valance band. This activity of the electrons flowing from the drain to the substrate and creating holes flowing to the drain create a leakage current in the substrate.

Japanese Laid-Open Patent Publication No. Hei 1-264264 (JP 1-264264) discloses a method for preventing such a leakage current due to inter-band tunneling. In JP 1-264264, inter-band tunneling is prevented by moderating the bending by altering a material to change the work function of the gate electrode in a region which overlaps the drain region. In this method, the gate electrode is constructed with conductor materials of different conductivity types in which the first conductivity type is used for the gate electrode over the channel area of the transistor and the second conductivity type is used for the gate electrode over the source-drain regions of the transistor. The conductor materials of different types are chosen such that their work functions are different from each other.

The present inventor has investigated, in detail, the leakage current caused by the above-mentioned inter-band tunneling in a semiconductor device using 256 Megabit and a 1 Gigabit Dynamic Random Access Memory technology.

The investigations have indicated that there appears to be a large influence in the leakage current caused by the above-mentioned inter-band tunneling. The influence of the leakage current is likely to appear when the drain voltage becomes relatively high, as in a voltage boosting circuit. In such a boosting circuit the inter-band tunneling phenomenon is typically found in P-channel MOSFETs instead of N-channel MOSFETs. Thus, in semiconductor devices there are transistors where inter-band tunneling may be problematic, but other transistors where inter-band tunneling may not occur. The present inventor has found that state of the art semiconductor devices may require a technique to optionally suppress inter-band tunneling depending upon the circuits in the semiconductor device in which the transistors are placed.

In the technique illustrated in JP 1-264264, use is made of different conductor materials for the gate electrode to suppress inter-band tunneling of a selected transistor. Such a technique may complicate the manufacturing process of the semiconductor device by increasing the number of processes to be performed during manufacturing. This may lower yield and may increase manufacturing costs.

In light of the above discussion, it would be desirable to provide a semiconductor device in which inter-band tunneling may be suppressed in selected transistors.

SUMMARY OF THE INVENTION

A semiconductor device according to the present embodiments may include an insulated gate filed effect transistor (IGFET) having a gate insulating layer, a gate electrode, and a source-drain layer. The IGFET may include a bird's beak insulating film in a region in which the gate insulating layer overlaps the source-drain layer. The bird's beak insulating film may have a thickness that is greater than the gate insulating film. In this way, inter-band tunneling may be reduced. A plurality of IGFETs may include bird's beak insulating films having different configurations in accordance with operating conditions of the circuit in which the particular IGFET is included.

According to one aspect of the embodiments, a semiconductor device may include a first IGFET. The first IGFET may include a gate insulating film having a film thickness greater in a first region where a gate electrode overlaps a first source-drain diffusion layer than in a channel region.

According to another aspect of the embodiments, the gate insulating film may have a film thickness greater in a second region where the gate electrode overlaps a second source-drain diffusion layer than in the channel region.

According to another aspect of the embodiments, the gate insulating film may form a bird's beak configuration where the gate insulating film may be thicker at the edge of the gate electrode.

According to another aspect of the embodiments, a second IGFET may have a second gate insulating film that does not have the bird's beak configuration.

According to another aspect of the embodiments, the source-drain diffusion layer may have a lightly doped drain (LDD) structure.

According to another aspect of the embodiments, the bird's beak configuration may be formed on the gate insulating film with a heat treatment in an oxidation atmosphere after the gate electrode is formed.

According to another aspect of the embodiments, a semiconductor device may include a first IGFET including a first IGFET gate insulating film, a first IGFET gate electrode, a first IGFET source-drain diffusion layer, and a first IGFET channel region. A first bird's beak insulating film may be formed in a first region where the first IGFET gate electrode overlaps the first IGFET source-drain region. The first bird's beak insulating film may have a thickness greater than the first IGFET gate insulating film. A second IGFET may include a second IGFET gate insulating film, a second IGFET gate electrode, a second IGFET source-drain diffusion layer, and a second IGFET channel region. A second bird's beak insulating film may be formed in a second region where the second IGFET gate electrode overlaps the second IGFET source-drain region. The second bird's beak insulating film may have a thickness greater than the second IGFET gate insulating film. The first bird's beak insulating film may have a different configuration than the second bird's beak insulating film.

According to another aspect of the embodiments, first bird's beak insulating film may be formed on the gate insulating film with a heat treatment in an oxidation atmosphere after the first IGFET gate electrode is formed.

According to another aspect of the embodiments, the first IGFET source-drain diffusion layer may be an LDD structure.

According to another aspect of the embodiments, the first IGFET may be a N-type IGFET and the second IGFET may be a P-type IGFET.

According to another aspect of the embodiments, the first bird's beak insulating film may have a first film thickness. The second bird's beak insulating film may have a second film thickness. The second film thickness may be greater than the first film thickness.

According to another aspect of the embodiments, the first bird's beak insulating film may have a first penetration depth under the first gate electrode. The second bird's beak insulating film may have a second penetration depth under the second gate electrode. The second penetration depth may be greater than the first penetration depth.

According to another aspect of the embodiments, a method of manufacturing a semiconductor device may include the steps of forming a first gate insulating film on the surface of a semiconductor substrate, forming a first gate electrode on the first gate insulating film, and introducing an impurity in a region around the first gate electrode for enhancing the speed of thermal oxidation. The first gate electrode may have a first gate width defined by a first first gate edge and a second first gate edge. The method may include the step of forming a first bird's beak insulating film under the first gate electrode at the first first gate edge and a second first gate edge.

According to another aspect of the embodiments, forming the first bird's beak insulating film may include heat treating the semiconductor substrate in an oxidation atmosphere.

According to another aspect of the embodiments, forming the first gate electrode may include forming a conductor film for covering the gate insulating film by depositing a first conductivity type polycrystalline silicon film.

According to another aspect of the embodiments, introducing the impurity may include introducing atoms of at least one of the group consisting of phosphorus, arsenic, halogen, or inert gas.

According to another aspect of the embodiments, introducing the impurity may include a tilt ion implantation.

According to another aspect of the embodiments, the method of manufacturing the semiconductor device may include the step of forming a second gate electrode. The second gate electrode may have a second gate width defined by a first second gate edge and a second second gate edge. The method of manufacturing the semiconductor device may include the step of forming a second bird's beak insulating film under the second gate electrode at the first second gate edge and the second second gate edge. The first bird's beak insulating film may have a different configuration than the second bird's beak insulating film.

According to another aspect of the embodiments, the first gate electrode may be a first IGFET gate electrode. The second gate electrode may be a second IGFET gate electrode. Introducing an impurity in the region around the first electrode includes introducing the impurity having a different dosage in a second region around the second gate electrode than in the region around the first gate electrode.

According to another aspect of the embodiments, the first IGFET may be a N-type MOSFET and the second IGFET may be a P-type MOSFET.

DETAILED DESCRIPTION OF THE EMBODIMENTS

Various embodiments of the present invention will now be described in detail with reference to a number of drawings.

Figure 1A:
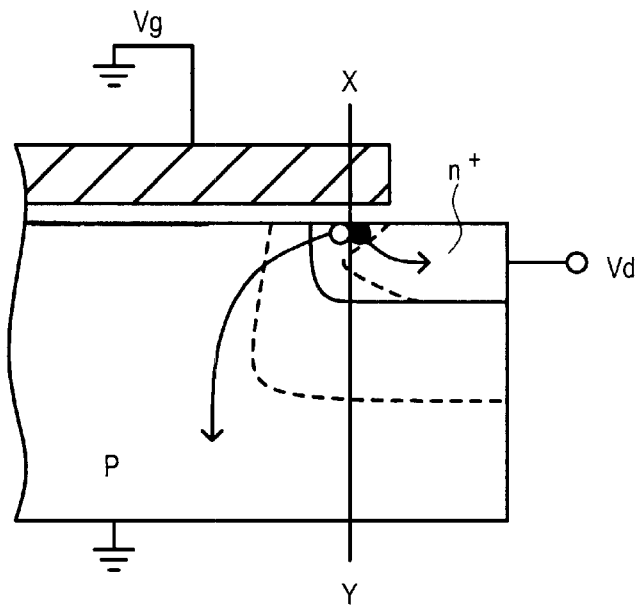
FIG. 1A is a cross sectional view of a portion of a conventional N-channel MOSFET.
Figure 1B:
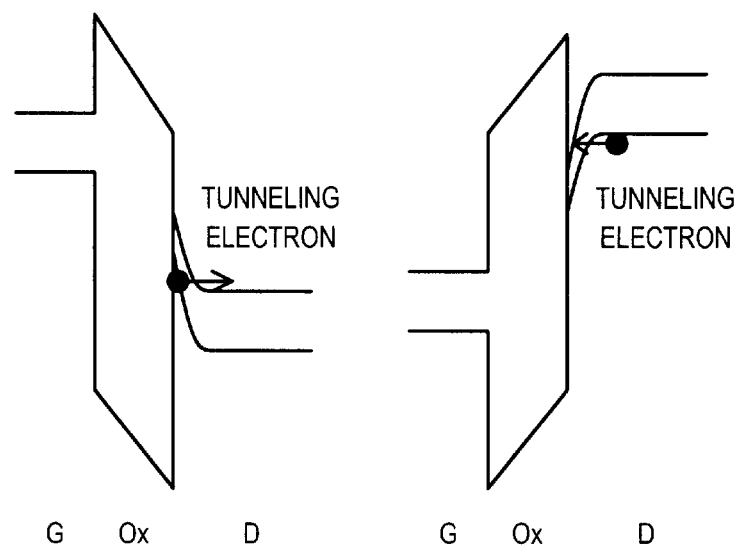
FIG. 1B is a band diagram of an N-channel MOSFET and a P-channel MOSFET.
Figure 2A:
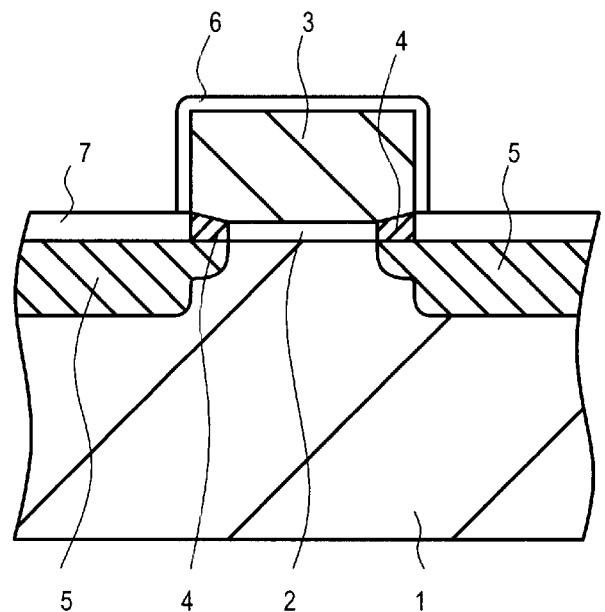
FIG. 2A is a cross-sectional view of a transistor according to one embodiment.

Referring now to FIG. 2A, a cross-sectional view of a transistor according to one embodiment is set forth.

The transistor in FIG. 2A may be an insulated gate field effect transistor (IGFET). As illustrated in FIG. 2A, a gate insulating film 2 may be formed on the surface of a silicon substrate 1. Gate insulating film 2 may be constructed with silicon oxinitride, etc., with a film thickness of about 4 nm. Gate electrode 3 may be formed on the gate insulating film 2. Gate electrode 3 may be tungsten polycide.

A bird's beak insulating film 4 may be formed on the gate insulating film 2 in a region where the gate electrode 3 may overlap a lightly doped drain (LDD) structured source-drain diffusion layer 5. Bird's beak insulating film 4 may be constructed with a silicon oxide film having a film thickness greater than the film thickness of gate insulating film 2. A protective insulating film 6 may be formed on the surface of gate electrode 3. Protective insulating film 6 may be a silicon oxide film. The surface of source-drain diffusion layer 5 may be covered with a protective insulating film 7. Protective insulating film 7 may be a silicon oxide film. Source drain diffusion layer 5 may provide a source region or a drain region of the IGFET. The IGFET may be a metal-oxide-semiconductor field effect transistor (MOSFET), as just one example. A manufacturing method for the IFGET will be described later in detail.

Figure 2B:
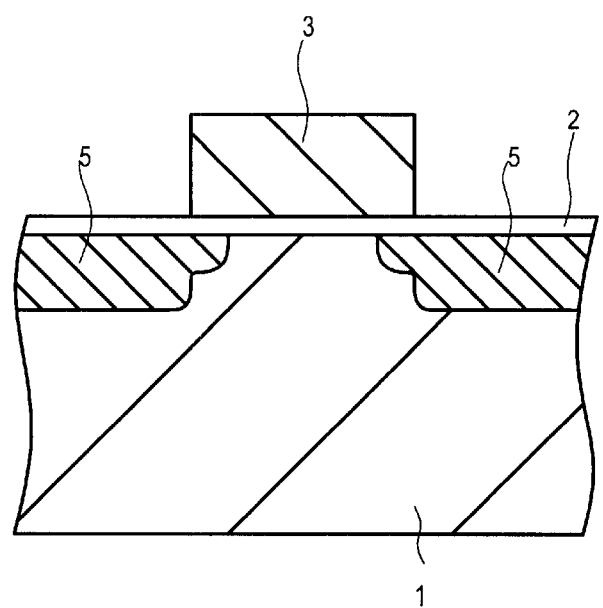
FIG. 2B is a cross-sectional view of a conventional MOSFET.

Referring now to FIG. 2B, a cross-sectional view of a conventional MOSFET is set forth. For comparison, FIG. 2B illustrates a conventional MOSFET in which no bird's beak insulating layer 4 exists. In other words, gate insulating film 2 is formed uniformly on the surface of silicon substrate 1. Source-drain diffusion layer 5 is separated from gate electrode 3 in an overlap region only by the thickness of gate insulating film 2.

Figure 3:
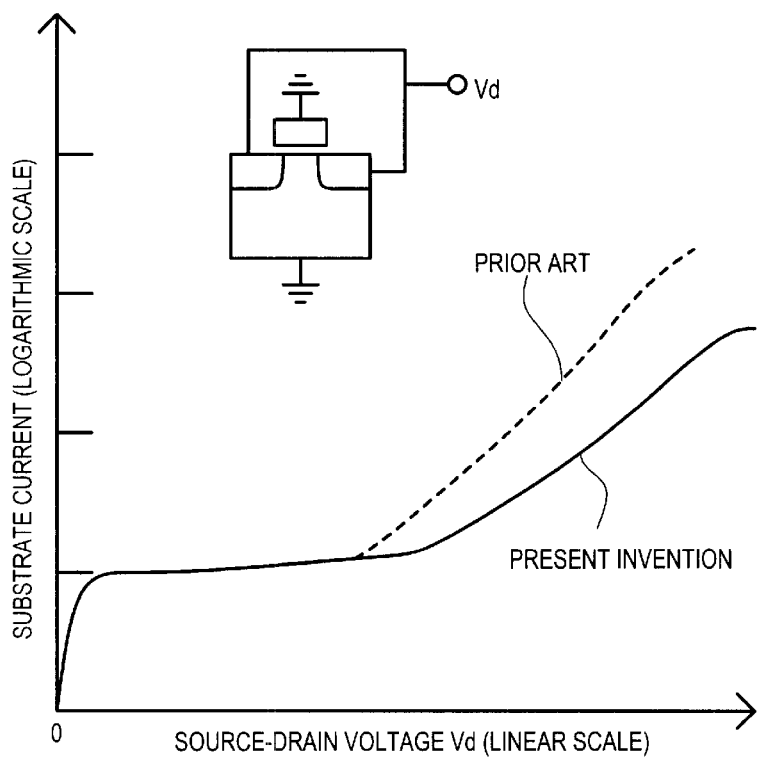
FIG. 3 is a graph illustrating leakage current in an IGFET as illustrated in FIG. 2A and a conventional IGFET structure.

Referring now to FIG. 3, a graph illustrating leakage current in an IGFET as illustrated in FIG. 2A and a conventional IGFET structure. The graph of FIG. 3, illustrates the leakage current when the gate electrode and substrate are fixed to the ground potential and a voltage Vd is applied to the source-drain regions. In FIG. 3, the source drain potential Vd is illustrated on the horizontal axis in a linear scale and the substrate current is illustrated on the vertical axis in a logarithmic scale.

As illustrated in FIG. 3, the leakage current of the n-type IGFET of the present invention as illustrated in FIG. 2A is a $n^+$-p junction leakage current and is illustrated with a solid line. The leakage current of the conventional n-type IGFET is illustrated with a dashed line. In the conventional IGFET, as the potential Vd increases beyond a certain value, the leakage current sharply increases. This is due to the occurrence of inter-band tunneling. For example, when the thickness of gate insulating film 2 is about 4 nm, the inter-band tunneling occurs at a potential Vd of about 3V.

In the case of a conventional p-type IGFET, the inter-band tunneling occurs at a potential Vd of about 2 V when the thickness of the gate insulating film is about 4 nm. No inter-band tunneling may occur in a p-type IGFET constructed according to the present invention.

The effect of the present invention when the IGFET of the present invention is applied to memory cells of a semiconductor device will be described. The memory cells may be dynamic random access memory (DRAM) cells consisting of one MOSFET, constituting a transfer gate, and one capacitor. The transfer gate may be similar to the n-channel IGFET illustrated in FIG. 2A.

Figure 4:
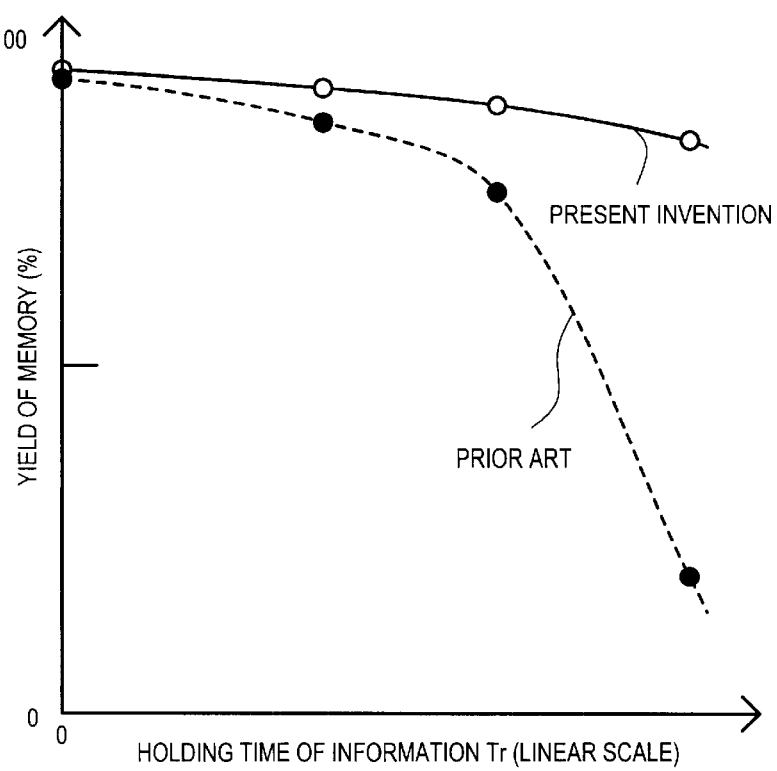
FIG. 4 is a graph illustrating the holding time of data stored in a memory device.

Referring now to FIG. 4, a graph illustrating the holding time of data stored in a memory device is set forth. The graph of FIG. 4 may include the holding time when a transfer gate under the present invention is used (solid line) and the holding time when a conventional transfer gate is used (dashed line). The holding time is illustrated on the horizontal axis in a linear scale while the yield is set forth on the vertical axis in a linear scale. The yield indicates the percentage of semiconductor memory devices that pass the pause test.

Referring once again to FIG. 4, it is found that even when the holding time Tr is increased, the yield of the memory devices is not excessively reduced, as illustrated with the solid line, when the transfer gate is constructed in accordance with the present invention. In comparison, the yield of conventional memory devices sharply decreases as illustrated with the dashed line. This is due to the deceased inter-band tunneling in the transfer gate constructed in accordance with the present invention, so that electric charge stored on the capacitor of the memory cell does not leak away as rapidly. The thickness of the gate insulating film of the IGFET used as the transfer gate is approximately 7 nm. As illustrated in the case of a DRAM, the present invention may have an advantageous impact even in a case in which the gate insulating film is relatively thick.

The source-drain diffusion layer of the IGFET according to the present invention was described as being an LDD structure. However, the present invention may also be applicable and enjoy a similar effect when the source-drain diffusion layer is not an LDD structure.

The formation of the bird's beak insulating film 4 that has been described in accordance with the present invention may be controlled so that the configuration of the bird's beak insulating film may be selectively changed depending upon the location on the semiconductor device. The configuration of the bird's beak may include the thickness of the bird's beak insulating film and the depth of invasion from the end of the gate electrode that the bird's beak covers the source-drain diffusion layer.

A second embodiment of the present invention will now be described with reference to FIGS. 5A, 5B, 5C, 6A, and 6B.

Referring now to FIGS. 5A, 5B, 5C, 6A, and 6B cross-sectional diagrams of a semiconductor device after various processing steps according to an embodiment is set forth. The FIGS. 5A, 5B, 5C, 6A, and 6B may illustrate cross-sectional diagrams of a P-type IGFET and a N-type IGFET having a bird's beak insulating film configuration after various processing steps.

Figure 5A:
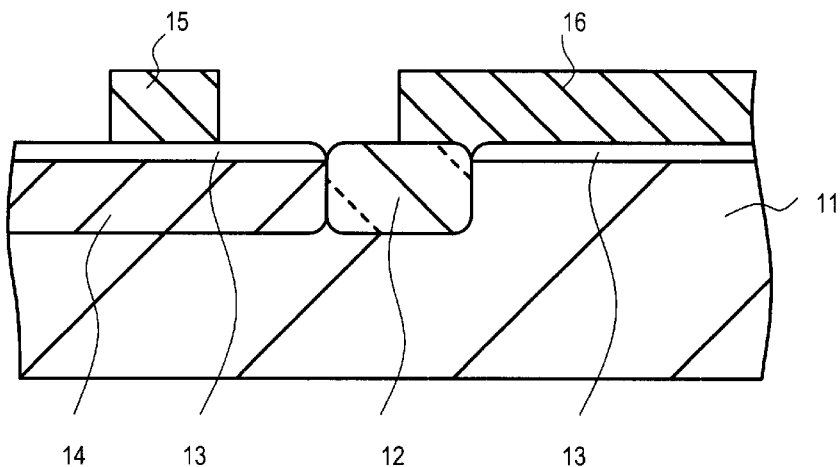
FIG. 5A is a cross-sectional diagram of a semiconductor device after various processing steps according to an embodiment.

As illustrated in FIG. 5A, a device separation insulating film 12 may be formed on the surface of a silicon substrate 11. Silicon substrate 11 may be a P-type silicon substrate. Separation insulating film 12 may be formed by making use of a trench separation method and an N-well layer 14. A gate insulating film 13 may be formed on the surface of silicon substrate 11. Gate insulating film 13 may be a 6 nm thick silicon oxide film. A polycrystalline film containing a phosphorus impurity and a tungsten silicide film may be laminated and deposited on gate insulating film 13. The laminated film may be processed with a well known photolithography technique and a dry etching technique. In this way, gate electrode 15 and conductor layer 16 may be formed as illustrated in FIG. 5A. Gate electrode 15 may have a length in a channel direction of about 0.25 µm.

Figure 5B:
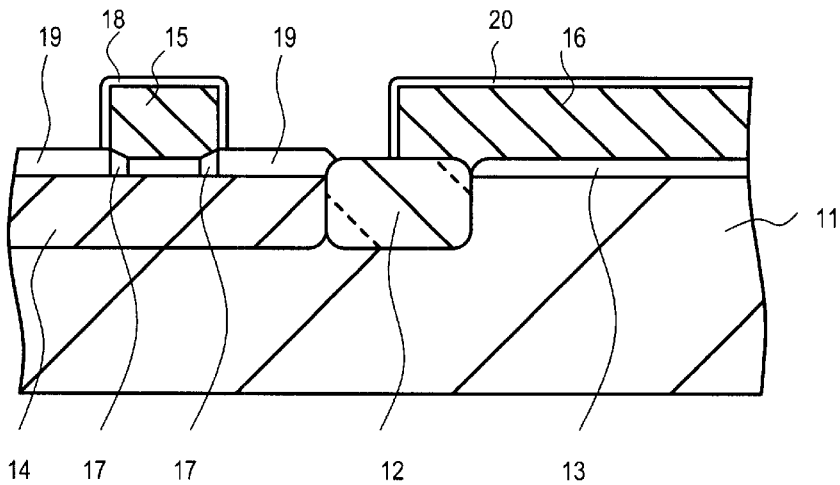
FIG. 5B is a cross-sectional diagram of a semiconductor device after various processing steps according to an embodiment.

Referring now to FIG. 5B, the surface of silicon substrate 11 may be thermally oxidized with the aid of rapid thermal oxidation (RTO). Processing conditions of the RTO may be executed in an oxygen atmosphere at about 1000° C. for about 1 minute. A illustrated in FIG. 5B, a bird's beak insulating film 17 may be formed on the lower side of the ends of the gate electrode 15 with the aid of the RTO processing. The thickness of the bird's beak insulating film may be about 7.5 nm. The invasion depth under the gate electrode 15 may be about 10 nm. Protective insulating films (18 and 19) may then be formed on the surfaces of gate electrode 15 and N-well layer 14. A protective insulating film 20 may also be formed simultaneously on the surface of conductor layer 16.

Figure 5C:
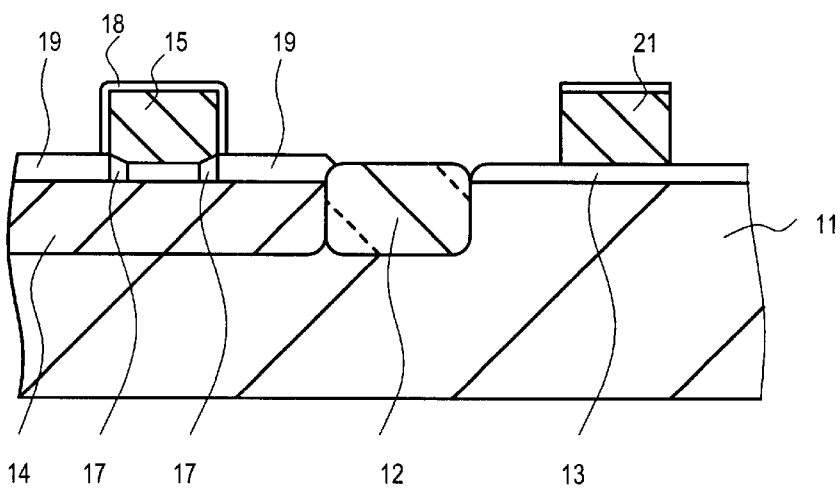
FIG. 5C is a cross-sectional diagram of a semiconductor device after various processing steps according to an embodiment.

Referring now to FIG. 5C, conductor layer 16 may be processed to form a gate electrode 21 on gate insulating film 13. Gate electrode 21 may have a length in the channel direction of 0.2 µm.

Figure 6A:
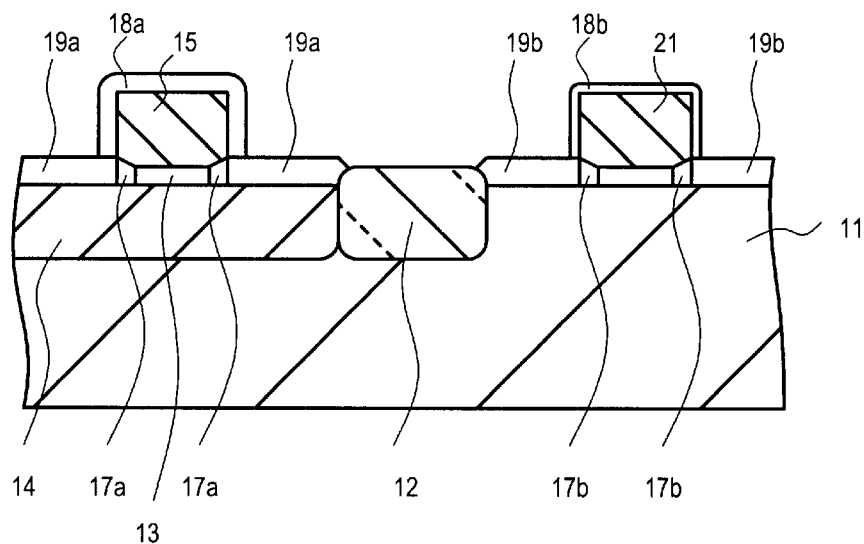
FIG. 6A is a cross-sectional diagram of a semiconductor device after various processing steps according to an embodiment.

Referring now to FIG. 6A, the surface of silicon substrate 11 may then be thermally oxidized again with the RTO processing. The RTO processing conditions can be at a temperature of about 1000° C. in an oxygen atmosphere for about 1 minute. After the RTO processing the end of gate electrode 15 may be thermally oxidized to form bird's beak insulating film 17a, as illustrated in FIG. 6A. The bird's beak insulating film 17a may have a thickness of about 8.5 nm, and the invasion depth under the gate electrode 15 may be about 20 nm. Protective insulating film (18a and 19a) may then be formed on the surface of gate electrode 13 and N-well layer 14.

At the same time, bird's beak insulting film 17b may be formed at the ends of gate electrode 21 with the RTO processing. The bird's beak insulating film 17b may have a thickness of about 7.5 nm, and the invasion depth under the gate electrode 21 may be about 10 nm. Protective insulating film (18b and 19b) may then be formed on the surface of gate electrode 21 and silicon substrate 11.

Figure 6B:
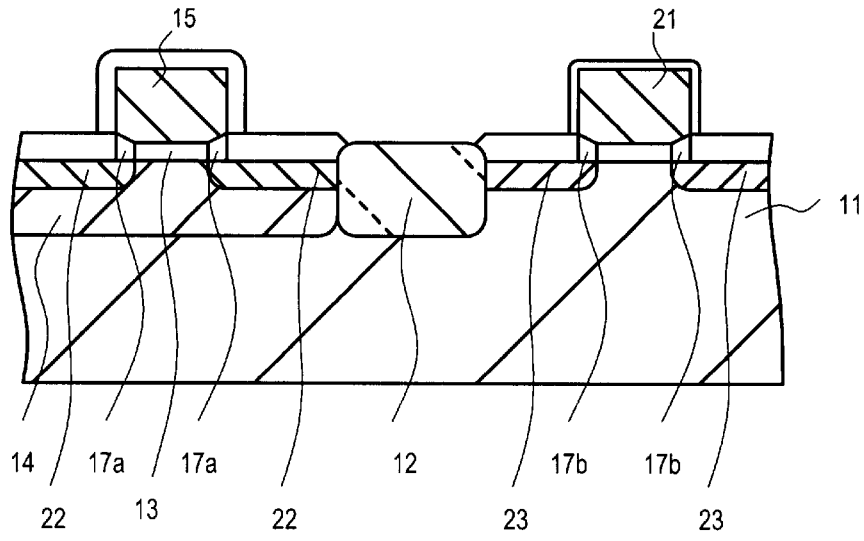
FIG. 6B is a cross-sectional diagram of a semiconductor device after various processing steps according to an embodiment.

Referring now to FIG. 6B, P-type source-drain diffusion layers 22 and N-type source-drain diffusion layers 23 may be formed by ion implantation, respectively of P-type impurity onto the surface of N-well layer 14 and N-type impurity onto the surface of silicon substrate 11 followed by a heat treatment.

Thus, a P-type IGFET may be formed on N-well layer 14. The P-type IGFET may include gate insulating film 13, gate electrode 15, and P-type source-drain diffusion layers 22. The P-type IGFET may also include bird's beak insulating film 17a formed in a region where gate electrode 15 overlaps P-type source-drain diffusion layers 22. At the same time, a N-type IGFET may be formed on silicon substrate 11. The N-type IGFET may include gate insulating film 13, gate electrode 21, and N-type source-drain diffusion layers 23. The N-type IGFET may also include bird's beak insulating film 17b formed in a region where gate electrode 21 overlaps N-type source-drain diffusion layers 23.

In the second embodiment of the present invention, there may be arbitrarily and selectively formed a bird's beak insulting film having a different film thickness and different depth of invasion for both the N-type IGFET and P-type IGFET. Furthermore, the semiconductor device may have bird's beak insulating film on some components, but not on others. For example, a circuit that produces high potentials on a drain of a particular IGFET may include components that have the previously mentioned bird's beak insulating film while other components on the semiconductor device may not have the bird's beak insulating film. Such a circuit can be a potential boosting circuit, as just one example.

A third embodiment of the present invention will now be described with reference to FIGS. 7A, 7B, 7C, 8A, and 8B.

Referring now to FIGS. 7A, 7B, 7C, 8A, and 8B cross-sectional diagrams of a semiconductor device after various processing steps according to an embodiment is set forth. The FIGS. 7A, 7B, 7C, 8A, and 8B may illustrate cross-sectional diagrams of an IGFET having a bird's beak insulating film configuration after various processing steps. The configuration of the bird's beak insulating film in the third embodiment may be more simply changed than the bird's beak insulating film in the second embodiment.

Figure 7A:
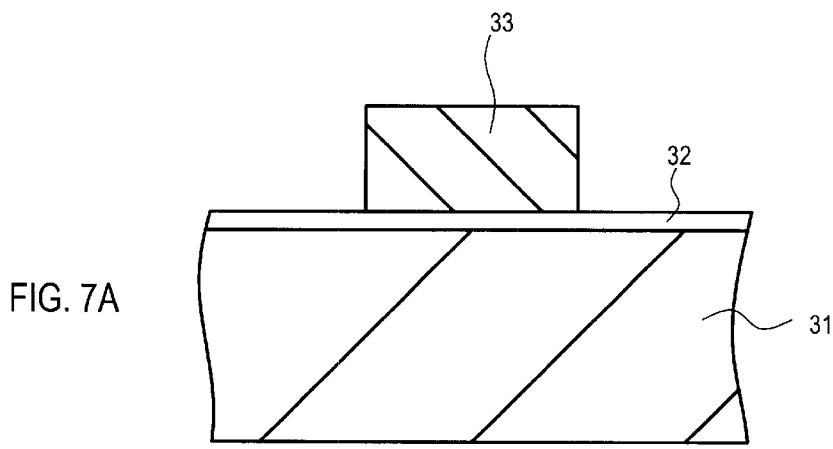
FIG. 7A is a cross-sectional diagram of a semiconductor device after various processing steps according to an embodiment.

Referring now to FIG. 7A, a gate insulating film 32 may be formed on the surface of silicon substrate 31. Gate insulating film may be a 3 nm thick silicon oxinitride film. A gate electrode 33 may be formed on the gate insulating film in a similar manner as in the second embodiment. Gate electrode 33 may have a length in the channel direction of 0.15 µm.

Figure 7B:
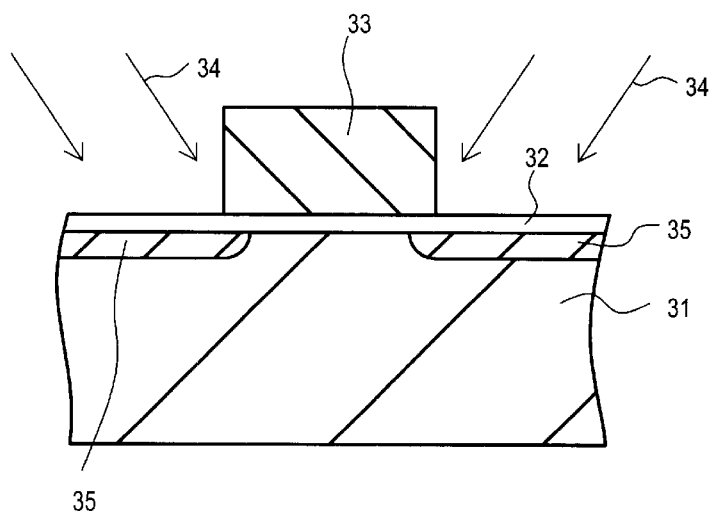
FIG. 7B is a cross-sectional diagram of a semiconductor device after various processing steps according to an embodiment.

Referring now to FIG. 7B, while using the gate electrode 33 as a mask, tilt ions 34 may be implanted into the surface of silicon substrate 31. The implantation of tilt ions 34 may be achieved by way of rotational tilt ion implantation.

Tilt ions 34 may include N-type impurities such as phosphorus and arsenic, inert gases or halogen gases. By implanting impurities using tilt ion implantation, impurity doped layer 35 may be formed on the surface of silicon substrate such that the impurity doped layer 35 may be overlapped by the end of the gate electrode 33. Thermal oxidation may be promoted in the impurity doped layer 35. The enhanced oxidation will be described later with reference to FIGS. 9 and 10.

Figure 7C:
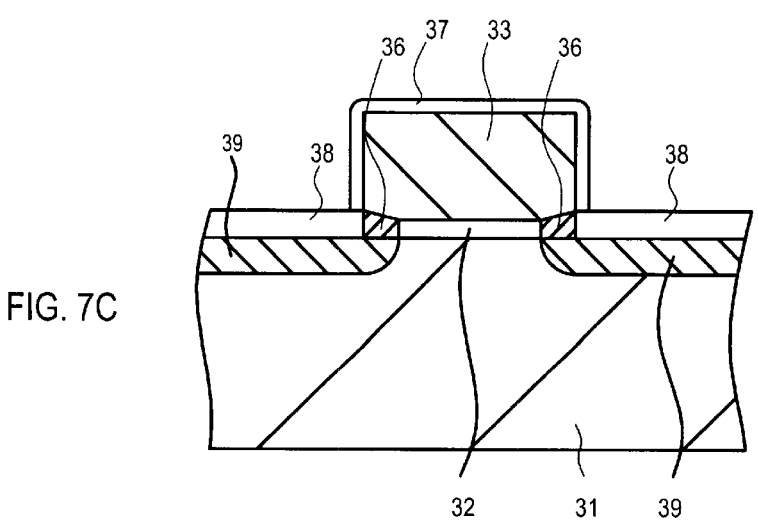
FIG. 7C is a cross-sectional diagram of a semiconductor device after various processing steps according to an embodiment.

Referring now to FIG. 7C, the surface of silicon substrate may be thermally oxidized with RTO as described in the second embodiment. The RTO processing may be performed at a temperature of 950° C. in an oxygen atmosphere for 1 minute. With the RTO processing, bird's beak insulating film 36 may be formed below the ends of gate electrode 33 as illustrated in FIG. 7C. Bird's beak insulating film 36 may have a thickness about 4.5 nm thicker than gate insulating film 32. Bird's beak insulating film 32 may have an invasion depth under gate electrode 33 of about 10 nm. Protective insulating films (37 and 38) may be formed on the surface of gate electrode and the surface of silicon substrate 31. Source-drain diffusion layers 39 may then be formed by implanting either N-type or P-type impurities followed by a heat treatment. N-type impurities may be implanted for a N-type IGFET and P-type impurities may be implanted for a P-type IGFET. It is noted, that the impurity concentration of the ion implantation in this step may be higher than the impurity concentration of the ion implantation during the tilt ion doping 34.

Figure 8A:
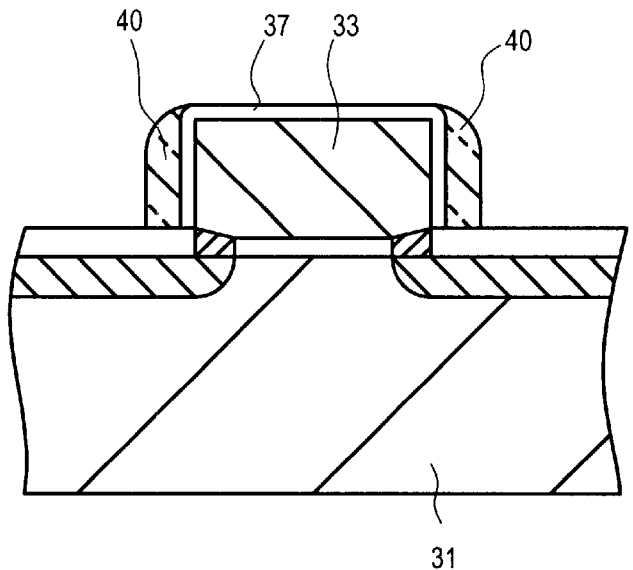
FIG. 8A is a cross-sectional diagram of a semiconductor device after various processing steps according to an embodiment.

Referring now to FIG. 8A, a side wall insulating film 40 may be formed on a side wall of gate electrode 33. Side wall insulating film 40 may be a silicon oxide film formed by chemical vapor deposition (CVD) and a dry etching step.

Figure 8B:
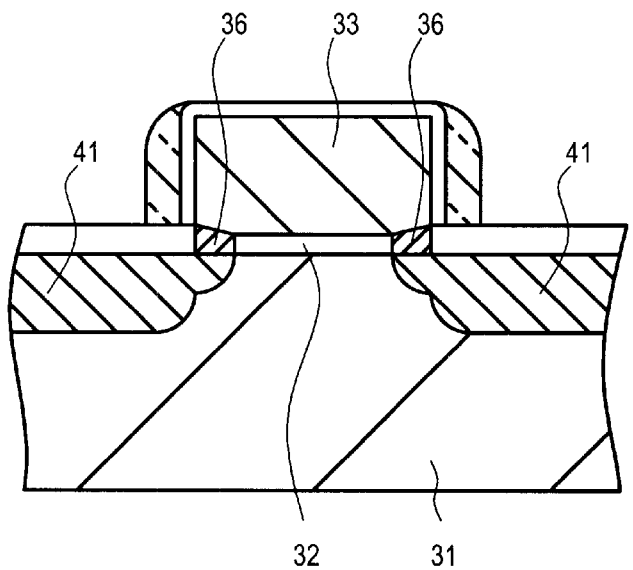
FIG. 8B is a cross-sectional diagram of a semiconductor device after various processing steps according to an embodiment.

Referring now to FIG. 8B, N-type or P-type impurity ion doping and heat treatment are successively performed. In this way, lightly doped drain (LDD) source-drain diffusion layer 41 is formed on the surface of silicon substrate 31. An IGFET is thus formed. The IGFET may include gate insulating film 32, gate electrode 33, and source-drain diffusion layer 41 disposed on silicon substrate 31. The IGFET may also include bird's beak insulating film 36 in a region where gate electrode 33 overlaps source-drain diffusion layer 41.

The relationship between the dose of tilt ion doping and enhanced oxidation upon the bird's beak insulating film being formed will now be described with reference to FIGS. 9 and 10.

Figure 9:
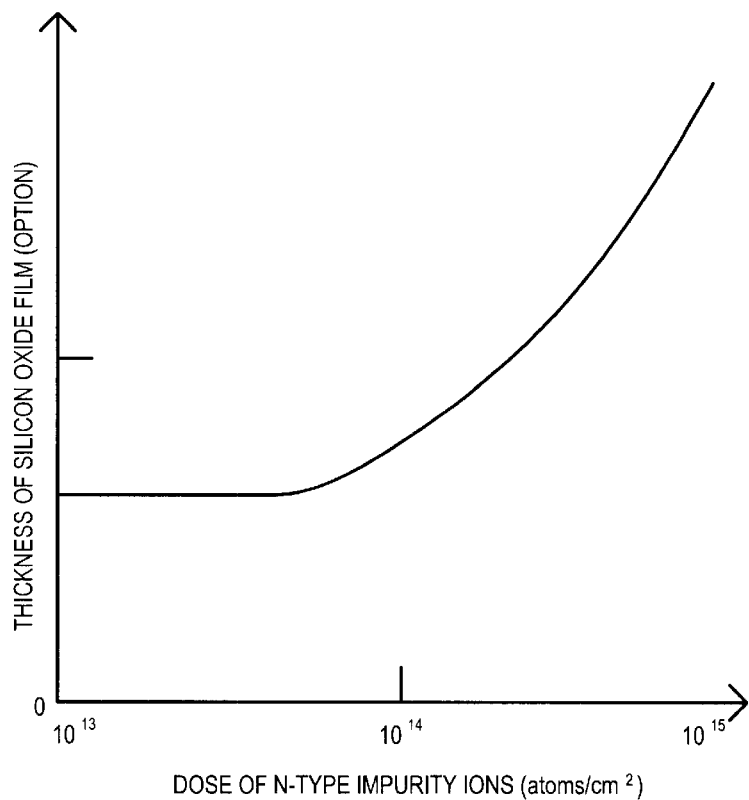
FIG. 9 is a graph illustrating a relationship between the dose of N-type impurity ion and thickness of silicon oxide film after thermal oxidation.

Referring now to FIG. 9, a graph illustrating a relationship between the dose of N-type impurity ion and thickness of silicon oxide film after thermal oxidation is set forth. The horizontal axis illustrates the dose of N-type impurity ions using tilt ion N-type impurities such as phosphorus or arsenic. The vertical axis illustrates the thickness of silicon oxide film after thermal oxidation by RTO. The thermal oxidation by RTO may be performed at about 1000° C. for about 10 seconds. When the dose of N-type impurities exceeds about $5 \times 10^{13}/cm^2$, the enhanced thermal oxidation appears and the thickness of the silicon oxidation film begins to increase. Initially, the silicon oxide film formed on the silicon substrate before the ion implantation is about 2.0 nm. Then after a dose of N-type impurities of about $1 \times 10^{14}/cm^2$, the silicon oxide film may be about 2.5 nm. With a dose of N-type impurities of about $3 \times 10^{14}/cm^2$, the silicon oxide film may be about 4.0 nm. By using the relationship between silicon oxide film and impurity dose as illustrated in FIG. 9, a different thickness bird's beak insulating film may be formed for a particular IGFET by selectively changing the impurity dose based on the requirements of the IGFET.

Figure 10:
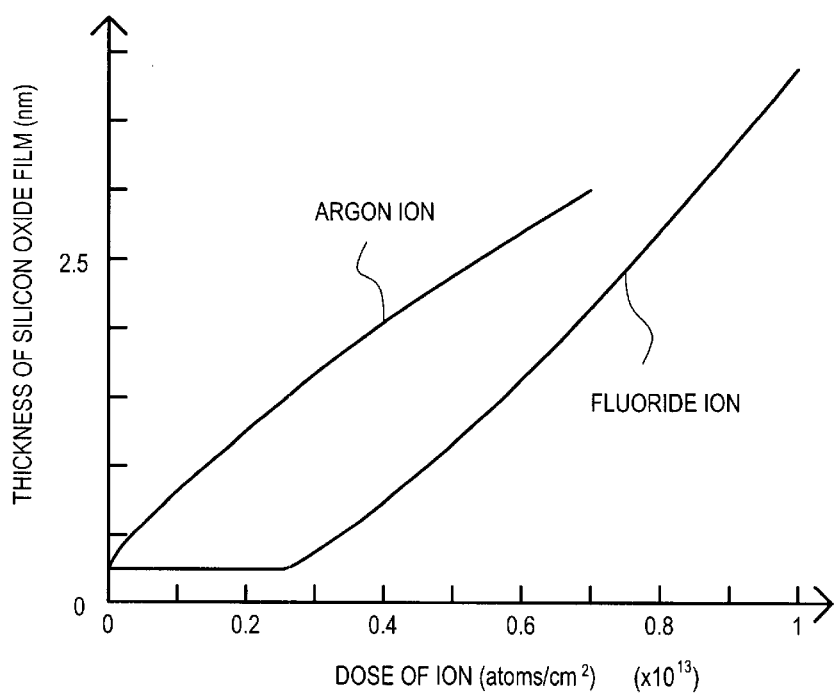
FIG. 10 is a graph illustrating the relationship between the dose of fluoride ions and argon ions and the thickness of the silicon oxide film after thermal oxidation.

Referring now to FIG. 10, a graph illustrating the relationship between the dose of fluoride ions and argon ions and the thickness of the silicon oxide film after thermal oxidation is set forth. The horizontal axis illustrates the dose of fluoride or argon ions using tilt ion implantation. The vertical axis illustrates the thickness of silicon oxide film after thermal oxidation by RTO. The thermal oxidation by RTO may be performed at about 1000° C. for about 15 seconds in an atmosphere of diluted oxygen.

Referring still to FIG. 10, when the doping ion is fluoride and the dose of fluoride ion exceeds about $3 \times 10^{14}/cm^2$, the thickness of the silicon oxidation film begins to monotonically increase. When the doping ion is argon, the silicon oxidation film increases more rapidly than when the doping ion is fluoride. By using the relationship between silicon oxide film and impurity dose as illustrated in FIG. 10, a different thickness bird's beak insulating film may be formed for a particular IGFET by selectively changing the impurity dose or impurity type based on the requirements of the IGFET.

In order to control the invasion depth of the bird's beak insulating film under the gate electrode, a doping angle or doping energy in the previously described tilt ion doping may be controlled.

In the embodiments mentioned above, the bird's beak insulating film may be formed to completely cover the surface of the source-drain diffusion layer that is overlapped by the end of the gate electrode. However, the present invention should not be limited to such a construction. For example, the bird's beak insulating film may be formed to cover only a portion of the surface of the source-drain diffusion layer that is overlapped by the end of the gate electrode. When there exists a higher impurity concentration region and a lower impurity concentration region in the source-drain diffusion layer (LDD structure, for example), the bird's beak insulating film may be formed so as to cover the surface of the high impurity concentration region.

Referring now to tables 1 and 2, the effect of the present invention where a bird's beak insulating film with a plurality of different configurations formed in a semiconductor device will now be described. Values listed in the table are leakage currents experimentally obtained by the inventor from a semiconductor device such as a 128 megabit DRAM. The gate insulating film of the IGFET may be 7 nm silicon oxide. The bird's beak insulating films for both example (I) and example (II) listed in the tables may be formed with the thermal oxidation process described in the second embodiment (RTO process performed two times).

TABLE 1

| BIRD'S BEAK | NMOS | | PMOS | |
| --- | --- | --- | --- | --- |
| INSULATING FILM | $I_{ON}$ | $I_{OFF}$ | $I_{ON}$ | $I_{OFF}$ |
| (I) FILM THICKNESS 8.5 nm PENETRATION DEPTH 10 nm | 540 ($\mu A/\mu m$) | 3 ($pA/\mu m$) | 270 ($\mu A/\mu m$) | 40 ($pA/\mu m$) |
| (II) FILM THICKNESS 9.5 nm PENETRATION DEPTH 20 nm | 500 ($\mu A/\mu m$) | 2 ($pA/\mu m$) | 250 ($\mu A/\mu m$) | 15 ($pA/\mu m$) |

In example (I), the film thickness of the bird's beak insulating film may be 8.5 nm and the penetration depth under the gate electrode may be 10 nm. In example (II), the film thickness of the bird's beak insulating film may be 9.5 nm and the penetration depth under the gate electrode may be 20 nm. As illustrated in Table 1, the operation speed of both the NMOS transistor and PMOS transistors may be approximately the same for both example (I) and example (II). This can be illustrated by noting that $I_{ON}$ is approximately the same for both examples (I) and (II). In the case of the leakage current, the NMOS transistor has a similar leakage current $I_{OFF}$ for both examples (D and (II). However, the leakage current $I_{OFF}$ of the PMOS transistor is substantially reduced in example (II) as compared to example (I). Based on these results, different bird's beak insulating films may be formed for the NMOS and PMOS transistors. For example, a bird's beak insulating film as illustrated in example (I) may be formed for the NMOS transistors and a bird's beak insulating film as illustrated in example (II) may be formed for the PMOS transistors. In this way, the performance of a semiconductor device incorporating the invention may be improved.

That gate electrode of the PMOS transistor may include polycide in a polycrystalline silicon film doped with an N-type impurity such as phosphorus. A PMOS transistor having a buried channel structure may be more conducive toward inter-band tunneling than a PMOS transistor having a surface channel structure.

TABLE 2

| BIRD'S BEAK INSULATING FILM | INPUT/OUPUT CIRCUIT $I_{OFF}$ (pA/μm) | INTERIOR CIRCUIT $I_{OFF}$ (pA/μm) |
|---|---|---|
| (I) FILM THICKNESS 8.5 nm PENETRATION DEPTH 10 nm | 100 | 8 |
| (II) FILM THICKNESS 9.5 nm PENETRATION DEPTH 20 nm | 20 | 6 |

Referring now to Table 2, a comparison of leakage currents ($I_{OFF}$) for an IGFET in an input/output circuit section of the semiconductor device and an IGFET in an interior circuit. In the example illustrated in FIG. 2, the IGFETs may be N-type MOSFETs. The IGFET in the input/output circuit has a substantially reduced leakage current ($I_{OFF}$) for the bird's beak insulating film of example (II) as compared to the bird's beak insulating film of example (I). In contrast, the IGFET in the interior circuit has a similar leakage current ($I_{OFF}$) for both example (I) and example (II). This difference can be caused by the higher operating voltage of the input/output circuit as compared to the interior circuit.

Based on these results, different bird's beak insulating films may be formed for an IGFET depending on the specific operation conditions of the circuit in which it is included. For example, a bird's beak insulating film as illustrated in example (I) may be formed for the IGFET in an interior circuit and a bird's beak insulating film as illustrated in example (II) may be formed for an IGFET in an input/output circuit. In this way, the performance of a semiconductor device incorporating the invention may be improved.

Although in the above embodiments, the gate electrode can include a polycide structure of a high melting point metal silicide layer/polycrystalline silicon layer, the present invention may also be applicable for a gate electrode including a laminate structure of a high melting point metal layer/polycrystalline silicon layer, as just one example.

In an IGFET according to the present invention, a semiconductor device may have a bird's beak insulating film that is thicker than the gate insulating film. The bird's beak insulating film may be formed in a region where the gate electrode overlaps the source-drain diffusion layer. In a semiconductor device employing the present invention, different IGFETs may have bird's beak insulating films having differing configurations. The different configurations may be dependent upon different circuit operating conditions or different IGFET types.

In a device incorporating the present invention, inter-band tunneling caused by band bending in a drain region of an IGFET may be reduced. In this way, the drain region leakage current may be greatly reduced. A bird's beak insulating film may be selectively formed in IGFETs incorporated in circuitry in which a drain voltage is relatively high. Such circuitry may include voltage boost circuitry or circuitry that receives a boosted voltage. In a DRAM, such circuitry may include boosted word line circuitry, output circuitry, and substrate pump circuitry, as just a few examples. In this way, leakage current due to inter-band tunneling in circuitry that may be stressed by higher voltages may be reduced and circuit construction may be simplified.

Leakage current due to inter-band tunneling may be reduced and the operating speed of the IGFET may be improved. This may improve the performance of a semiconductor device incorporating the present invention.

With the present invention, an IGFET may be manufactured with smaller dimensions. This may allow devices to be more densely manufactured, thereby increasing integration of the semiconductor device and reducing manufacturing costs.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
   a first insulated gate field effect transistor (IGFET), the first IGFET includes a gate insulating film having a film thickness greater in a first region where a gate electrode overlaps a first source-drain diffusion layer than in a channel region and the gate insulating film forms a bird's beak configuration where the gate insulating film is thicker at the edge of the gate electrode; and
   a second IGFET having a second gate insulating film that does not have the bird's beak configuration.

2. The semiconductor device according to claim 1, wherein:
   the gate insulating film has a film thickness greater in a second region where the gate electrode overlaps a second source-drain diffusion layer than in the channel region.

3. The semiconductor device of claim 1, wherein:
   the source-drain diffusion layer includes a lightly doped drain (LDD) structure.

4. The semiconductor device of claim 1, wherein
   the bird's beak configuration is formed with a heat treatment in an oxidation atmosphere after the gate electrode is formed.

5. A semiconductor device, comprising:
   a first IGFET including a first IGFET gate insulating film, a first IGFET gate electrode, a first IGFET source-drain diffusion layer, and a first IGFET channel region;

a first bird's beak insulating film formed in a first region where the first IGFET gate electrode overlaps the first IGFET source-drain region, the first bird's beak insulating film having a thickness greater than the first IGFET gate insulating film;

a second IGFET including a second IGFET gate insulating film, a second IGFET gate electrode, a second IGFET source-drain diffusion layer, and a second IGFET channel region;

a second bird's beak insulating film formed in a second region where the second IGFET gate electrode overlaps the second IGFET source-drain region, the second bird's beak insulating film having a thickness greater than the second IGFET gate insulating film; and the first bird's beak insulating film has a different configuration than the second bird's beak insulating film.

6. The semiconductor device of claim 5, wherein:

the first bird's beak insulating film is formed on the gate insulating film with a heat treatment in an oxidation atmosphere after the first IGFET gate electrode is formed.

7. The semiconductor device of claim 5, wherein:

the first IGFET source-drain diffusion layer is a lightly doped drain (LDD) structure.

8. The semiconductor device of claim 5, wherein:

the first IGFET is a N-type IGFET and the second IGFET is a P-type IGFET.

9. The semiconductor device of claim 5, wherein:

the first bird's beak insulating film has a first film thickness;

the second bird's beak insulating film has a second film thickness; and the second film thickness is greater than the first film thickness.

10. The semiconductor device of claim 5, wherein:

the first bird's beak insulating film has a first penetration depth under the first gate electrode;

the second bird's beak insulating film has a second penetration depth under the second gate electrode; and the second penetration depth is greater than the first penetration depth.

11. A method of manufacturing a semiconductor device, comprising the steps of:

forming a first gate insulating film on the surface of a semiconductor substrate;

forming a first gate electrode on the first gate insulating film, the first gate electrode having a first gate width defined by a first first gate edge and a second first gate edge;

introducing an impurity in a region around the first gate electrode for enhancing the speed of thermal oxidation; and forming a first bird's beak insulating film under the first gate electrode at the first first gate edge and the second first gate edge.

12. The method of manufacturing a semiconductor device of claim 11, wherein:

forming the first bird's beak insulating film includes heat treating the semiconductor substrate in an oxidation atmosphere.

13. The method of manufacturing a semiconductor device of claim 11, wherein:

forming the first gate electrode includes forming a conductor film for covering the gate insulating film by depositing a first conductivity type polycrystalline silicon film.

14. The method of manufacturing a semiconductor device of claim 11, wherein:

introducing the impurity includes introducing atoms of at least one of the group consisting of phosphorus, arsenic, halogen, or inert gas.

15. The method of manufacturing a semiconductor device of claim 11, wherein:

introducing the impurity includes a tilt ion implantation.

16. The method of manufacturing a semiconductor device of claim 11, further including the steps of:

forming a second gate electrode, the second gate electrode having a second gate width defined by a first second gate edge and a second second gate edge;

forming a second bird's beak insulating film under the second gate electrode at the first second gate edge and the second first second edge; and the first bird's beak insulating film has a different configuration than the second bird's beak insulating film.

17. The method of manufacturing a semiconductor device of claim 16, wherein:

the first gate electrode is a gate electrode for a first IGFET;

the second gate electrode is a gate electrode for a second IGFET; and introducing an impurity in the region around the first gate electrode includes introducing the impurity having a different dosage in a second region around the second gate electrode than in the region around the first gate electrode.

18. The method of manufacturing a semiconductor device of claim 17, wherein:

the first IGFET is a N-type MOSFET; and
the second IGFET is a P-type MOSFET.

* * * * *